April 1, 1969 P. C. NEWMAN 3,436,625

SEMICONDUCTOR DEVICE COMPRISING III-V EPITAXIAL DEPOSIT ON SUBSTITUTIONAL III-V SUBSTRATE

Filed Aug. 2, 1966

INVENTOR.

PETER C. NEWMAN

BY

Frank R. Jifari

AGENT 3,436,625
Patented Apr. 1, 1969

3,436,625

SEMICONDUCTOR DEVICE COMPRISING III–V EPITAXIAL DEPOSIT ON SUBSTITUTIONAL III–V SUBSTRATE

Peter Colin Newman, Crawley, England, assignor to North American Philips Company, Inc., New York, N.Y., a corporation of Delaware Filed Aug. 2, 1966, Ser. No. 569,644
Claims priority, application Great Britain, Aug. 19, 1965, 35,625/65
Int. Cl. H01l 3/00, 15/00
U.S. Cl. 317—237 12 Claims

ABSTRACT OF THE DISCLOSURE

A semiconductor device comprising a III–V compound or substituted compound epitaxially deposited on a substituted III–V compound substrate formed by diffusion of a III or V element, especially useful as a photosensitive device or opto-electronic transistor.

Figure 1:
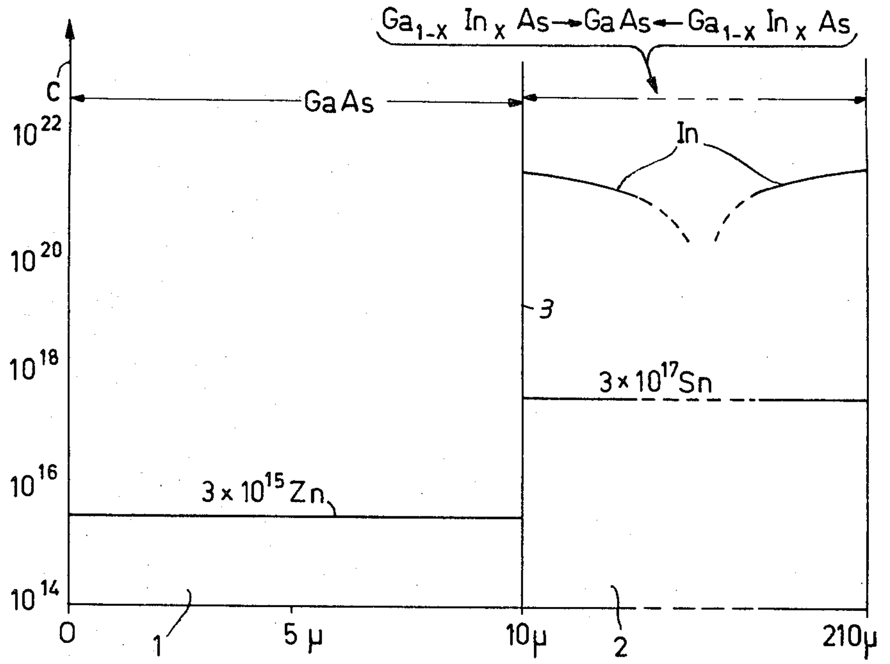

This invention relates to a semiconductor device, for example, a photo-electric semiconductor diode or an opto-electronic transistor, comprising a semiconductor body having a first portion formed by epitaxial deposition of a III–V semiconductor compound material or a substituted III–V semiconductor compound material on a second portion of a substituted III–V semiconductor compound of lower energy gap than the epitaxially deposited III–V semiconductor compound material or substituted III–V semiconductor compound material.

A III–V semiconductor compound is to be understood to mean a compound between substantially equal atomic amounts of an element of the class consisting of boron, aluminum, gallium and indium of Group III of the Periodic Table and an element of the class consisting of nitrogen, phosphorus, arsenic and antimony of Group V of the Periodic Table. A substituted III–V semiconductor compound is to be understood to mean a III–V semiconductor compound in which some of the atoms of the element of the above class of Group III are replaced by atoms of a substitutional element or substitutional elements of the same class and/or some of the atoms of the element of the above class of Group V are replaced by atoms of a substitutional element or substitutional elements of the same class.

Photo-electric semiconductor diodes are to be understood to include photo-diode radiation detectors for detecting narrow band radiation and photo-diode detectors, such as solar cells, for collecting broad band radiation. In the operation of a photo-diode comprising a semiconductor body having a p-n junction with electrodes on each side of the junction, the radiation to be detected is arranged to be incident on the semiconductor body near the p-n junction, usually within a distance therefrom of a few diffusion lengths of the free charge carriers in the semiconductor body. The photo-diode may be operated as occurs in photo-diode solar cells such that the radiation produces an electric voltage at the electrodes and/or an electric current in an external circuit between the electrodes. The photo-diode may be operated such as occurs in photo-diode radiation detectors by applying a reverse voltage to the p-n junction between the electrodes, the current produced in an external circuit between the electrodes by the radiation being a measure of the radiation. In both cases the operation is such that photons are absorbed in the semiconductor body with the generation of electron-hole pairs. Electron-hole pairs which are generated in the depletion region of the junction or within a diffusion length of the depletion region are rapidly separated by the electric field at the junction and contribute to the output current. It is therefore desirable that absorption of the incident radiation shall occur in the body within the depletion region of the p-n junction or within a carrier diffusion length of the depletion region.

The absorption length of photons of the incident radiation is dependent, inter alia, upon the energy gap of the semiconductor material and, for a given wavelength, generally increases with increasing energy gap of the semiconductor material. The absorption length L is defined by the equation $I(x)=I(o)\ \exp\ (-x/L)$, which holds within the material for plane radiation of a given wavelength. Here $I(o)$=light intensity at a reference plane
$x$=distance from reference plane
$I(x)$=light intensity at $x$.

A photo-diode comprising a p-n heterojunction between a first portion of a first semiconductor material and a second portion of a second semiconductor material of lower energy gap than the first material is known. The second semiconductor material is chosen in accordance with the energy value of the radiation to be detected and such that the absorption length of the photons of the incident radiation is low in the material. The semiconductor material of the first portion is chosen such that the energy gap is greater than the energy value of the radiation to be detected and such that the absorption length of this radiation is high in the material. The first portion of semiconductor material of higher energy gap thus acts as an effective window for the radiation to be detected and the necessity, as occurs in photo-diodes of a single semiconductor material, of locating the p-n junction very close to the surface on which the radiation is incident is at least partly obviated. The term opto-electronic transistor is to be understood to mean a semiconductor device having a semiconductor body comprising in order of succession an emitter zone of one conductivity type, a base zone of the opposite conductivity type and a collector zone of the one conductivity type, the emitter-base junction forming a p-n junction intended for radiation emission and the collector-base junction forming a photo-sensitive p-n junction capable of converting the photons emitted from the emitter-base junction into electrical energy.

Such an opto-electronic transistor may generally have a PNP or NPN structure with a single connection to the region of the body intermediate the first and second junctions, but in certain instances the structure may be such that more than one connection is made to the region of the body intermediate the first and second junctions, for example, when the intermediate region comprises a high resistivity part serving to electrically isolate the junctions. The principle of small signal operation of p-n-p opto-electronic transistor is as follows:

The emitter-base junction is forward biased to obtain a region of excess carrier concentration each side of this junction. The semiconductor material and impurity content are chosen such that a large proportion of the hole-electron pairs recombine with the emission of photons.

The collector-base junction is reverse biased to obtain a depletion region. Hole-electron pairs are liberated in the depletion region by the photons emitted from the first junction which reach the depletion region and the hole-electron pairs are rapidly separated by the field, the holes flowing to the collector and the electrons to the base.

The input signal modulates the emitter-base current. This change in current produces a change in the number of photons emitted. The change in collector-base current follows the change in emitter-base current and the $\alpha_0$ of the opto-electronic transistor may approach unity if certain conditions are satisfied. Most of the photons emitted should reach the depletion region of the collector-base junction and be absorbed therein and converted into current with a quantum efficiency approaching unity.

The semiconductor material of the base region must be chosen to have a low absorption constant for the emitted photons and its thickness made significantly less than one absorption length. The semiconductor material and impurity concentration of the collector region must be chosen such that the emitted photons have an absorption length which is less than the width of the depletion region of the collector-base junction. In order to achieve this a change in the absorption constant in the semiconductor material is required in the region of the body in which collection of the photons occurs and to this end it has hitherto been proposed to make the collector-base junction a heterojunction between the base region of a first semiconductor material and a collector region of a second semiconductor material having a lower energy gap than the first semiconductor material.

Furthermore methods are known for manufacturing photodiodes and opto-electronic transistors by the epitaxial deposition from the vapour phase of a first portion of gallium arseno-phosphide on a second portion of gallium arsenide followed by subsequent processing to form the photo-diode or the opto-electronic transistor respectively, with the photo-sensitive p-n junction located in the gallium arsenide spaced by a certain amount from the interface between the first and second portions. The second portion of gallium arsenide forms the substrate on which epitaxial deposition of the first portion of gallium arseno-phosphide is made. In some devices, for example, photo-diodes for collecting broad band radiation, such as solar cells, it is desirable to match the energy gaps of the two semiconductor materials to the width of the spectrum to be detected. In some cases this may require a semiconductor material as a substrate having a lower energy gap than gallium arsenide and on which higher energy gap material is epitaxially deposited. In opto-electronic transistors it may be desired to form the base-collector junction in a material having a lower energy gap than gallium arsenide and form the emitter-base junction in gallium arsenide. This is because it is easier to achieve a higher efficiency in the recombination radiation in gallium arsenide than is obtainable in a substituted compound such as gallium arseno-phosphide. Thus in both photo-diodes and opto-electronic transistors it may be desired that the substrate material is a substituted III–V semiconductor compound which has a lower energy gap than gallium arsenide.

According to the invention, a semiconductor device comprising a semiconductor body having a first portion formed by epitaxial deposition of a III–V semiconductor compound material or a substituted III–V semiconductor compound material on a second portion of a substituted III–V semiconductor compound of lower energy gap than the epitaxially deposited III–V semiconductor compound material or substituted III–V semiconductor compound material is characterized in that said second portion is formed by diffusion of a substitutional element or elements into a III–V semiconductor compound body or body part.

In such a device the second portion is of a substituted III–V semiconductor compound formed by a diffusion process and has the advantage of relative simplicity of manufacture while permitting a wide choice of the semiconductor materials of the first and second portions. When the first portion is of an unsubstituted III–V semiconductor compound the first and second portions of the device are formed by the initial diffusion into a III–V semiconductor compound body or body part to form the second portion followed by the epitaxial deposition of a III–V semiconductor compound material of higher energy gap than the substituted III–V semiconductor compound of the second portion. Hence the additional advantage occurs that the deposition of a substituted compound is not involved at all and this is of advantage in the manufacture of some devices since the epitaxial deposition of some substituted compounds is not easily performed, this technology not being as far advanced as the epitaxial deposition of some unsubstituted compound materials such as gallium arsenide. Furthermore in opto-electronic transistors having such a structure the emitter-base junction is formed in the epitaxially deposited first portion in a part which consists of an unsubstituted compound and hence efficient recombination radiation may more easily be obtained.

The change in energy gap of the material of the semiconductor body from the first portion to the second portion in the vicinity of the interface may be abrupt, the first portion in the vicinity of the interface consisting of the epitaxially deposited III–V semiconductor compound material or substituted III–V semiconductor compound material.

A part of the first portion adjacent the interface may consist of a substituted III–V semiconductor compound formed by diffusion of the substitutional element or elements of the second portion from the second portion into the epitaxially deposited III–V semiconductor compound material or substituted III–V semiconductor compound material of the first portion.

In a semiconductor device according to the invention a first region of the body of one conductivity tape (p or n) may lie wholly within the first portion and a second region of the body of the opposite conductivity type (n or p) lies wholly within the second portion with the p-n junction between the first and second regions coinciding substantially with the interface between the first and second portions. Such a device in which the p-n junction coincides substantially with the interface between the two semiconductor materials is readily obtained by epitaxial deposition of material of the first portion containing a conductivity type determining impurity element characteristic of the one type on a second portion containing a conductivity type determining impurity element charactersitic of the opposite type.

In a further semiconductor device according to the invention a first region of the body of one conductivity type (p or n) lies predominantly within the first portion and a second region of the body of the opposite conductivity type (n or p) lies wholly within the second portion with the p-n junction between the first and second regions lying in the second portion spaced from the interface between the first and second portions. Such a device when constituting a photoelectric semiconductor diode is in accordance with a photo-diode described in co-pending patent application No. 14,739/65 (PHB 31,424) and when constituting an opto-electronic transistor is in accordance with an opto-electronic transistor described in co-pending British patent application No. 33,875/64 (PHB 31,325).

In the latter described devices, in accordance with further features described in the said co-pending application, the p-n junction between the first and second regions may be spaced from the interface by a distance such that in operation the depletion region of the junction of the junction lies substantially wholly within the second portion of the body.

The location of the p-n junction spaced from the interface may have been determined by the diffusion in the vicinity of the interface of a conductivity type determining impurity element characteristic of the one type, initially present in the epitaxially deposited first portion in a substantially uniform concentration, from the first portion into the second portion initially containing a substantially uniform concentration of a conductivity type determining impurity element characteristic of the opposite type and lower than the concentration of the impurity element of the one type in the first portion.

In the semiconductor device according to the invention in which a part of the first portion adjacent the interface consists of a substituted III–V semiconductor compound formed by diffusion of the substitutional element or elements of the second portion from the second portion into the epitaxially deposited III–V semiconductor compound material or substituted III–V semiconductor compound material of the first portion, a first region of the body of one conductivity type (p or n) may lie wholly within the first portion and a second region of the body of opposite conductivity type (n or p) lies predominantly within the second portion with the p-n junction between the first and second regions lying spaced from the interface between the first and second portions in that part of the first portion consisting of the substituted III–V semiconductor compound formed by the said diffusion of the substitutional element or elements of the second portion and from the second portion.

In this device the p-n junction lying in the first portion may be spaced from the interface by a distance such that in operation the depletion region of the junction lies substantially wholly within the first portion of the body and preferably the p-n junction lying in the first portion is spaced from the interface by a distance such that in operation the depletion region of the junction lies substantially wholly within that part of the first portion consisting of the substituted III–V semiconductor compound formed by the said diffusion of the substitutional element or elements of the second portion and from the second portion.

The location of the p-n junction in the first portion spaced from the interface may have been determined by the diffusion in the vicinity of the interface of a conductivity type determining impurity element characteristic of the opposite type, initially present in the second portion in a substantially uniform concentration, from the second portion into the first portion initially containing a substantially uniform concentration of a conductivity type determining impurity element characteristic of the one type and lower than the concentration of the impurity element of the opposite type in the second portion.

The semiconductor body may comprise a first portion formed by epitaxial deposition of gallium arsenide on a second portion of gallium indium arsenide ($Ga_{1-x}In_xAs$) formed by diffusion of indium into a gallium arsenide body or body part. Such a structure may be advantageously employed in opto-electronic transistors and in photo-diodes for detecting radiation having photon energies lying between the energy gaps of gallium arsenide and gallium indium arsenide.

The semiconductor body may comprise a first portion formed by epitaxial deposition of gallium arseno-phosphide ($GaAs_{1-x}P_x$) on a second portion of gallium indium arsenide ($Ga_{1-x}In_xAs$) formed by diffusion of indium into a gallium arsenide body or body part. Such a structure in which the difference between the energy gaps of the two semiconductor materials is greater than the difference in energy gaps obtained with gallium arsenide and gallium indium arsenide may be advantageously employed in photo-diodes for collecting broader band radiation having photon energies lying between the energy gaps of gallium arseno-phosphide and gallium indium arsenide.

The semiconductor body may comprise a first portion formed by epitaxial deposition of gallium phosphide on a second portion of gallium arseno-phosphide formed by diffusion of phosphorous into a gallium arsenide body or body part. Such a structure may be advantageously employed in photo-diodes for detecting radiation having somewhat greater photon energies than in the previous cases.

One preferred device according to the invention is a photo-diode in which the p-n junction between the first and second regions is the photo-sensitive junction of the photo-diode.

The photo-diode may comprise a first portion formed by epitaxial deposition of gallium arsenide or gallium arseno-phosphide containing an acceptor element on a second portion of n-type gallium indium arsenide ($Ga_{1-x}In_xAs$) formed by diffusion of indium into an n-type gallium arsenide body or body part.

In such a photo-diode the p-n junction may lie in the first portion spaced from the interface in a part consisting of gallium indium arsenide formed by diffusion of indium from the second portion into the first portion, the p-n junction having been located in the first portion by diffusion of the donor element from the second portion into the first portion. The donor element in the second portion and diffused into the first portion may be tin and the acceptor element in the epitaxially deposited first portion may be zinc.

A further preferred device according to the invention is an opto-electronic transistor, in which the p-n junction between the first and second regions is the base-collector junction of the opto-electronic transistor, the first region being the base region and the second region being the collector region.

In accordance with features described and claimed in copending application No. 33,875/64, in this device the collector-base junction may surround the emitter-base junction within the semiconductor body and the collector-base junction and the emitter-base junction terminate only in a common plane surface of the semiconductor body.

The opto-electronic transistor may comprise a p-type collector region of gallium indium arsenide ($Ga_{1-x}In_xAs$) formed by diffusion of indium in a cavity extending into a gallium arsenide body from a plane surface thereof, an n-type base region and a p-type emitter region of gallium arsenide epitaxially deposited in the cavity of the gallium indium arsenide ($Ga_{1-x}In_xAs$).

The material of the emitter and base regions epitaxially deposited in the cavity on the gallium indium arsenide ($Ga_{1-x}In_xAs$) may be of gallium arsenide having a substantially uniform donor concentration and the emitter-base junction may have been located by diffusion of an acceptor element into part of the surface of this epitaxially deposited material.

Figure 2:
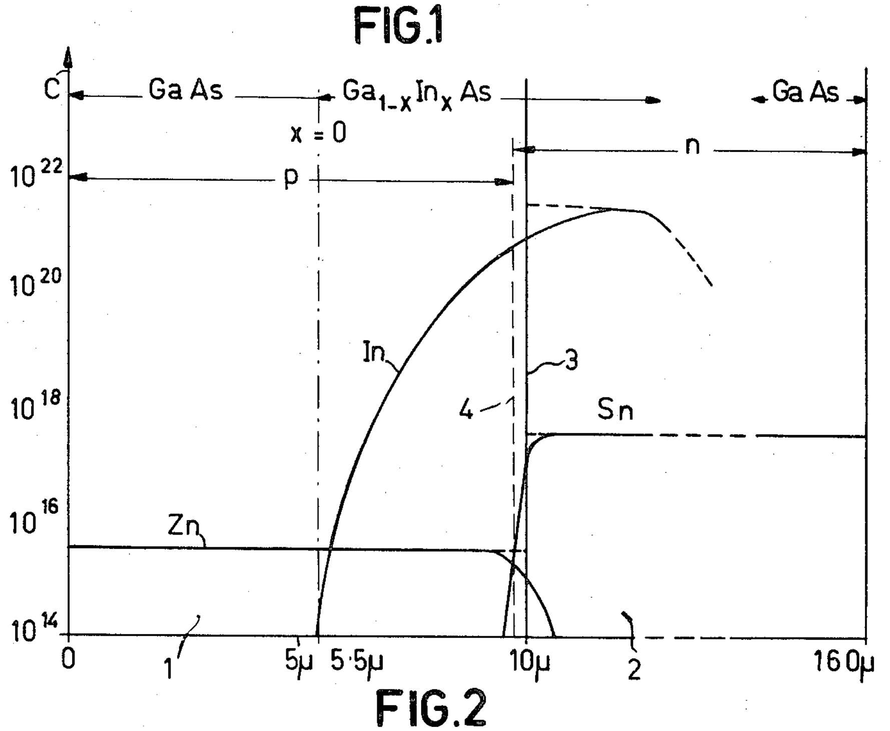

An embodiment of a photo-electric semiconductor diode according to the invention will now be described, by way of example, to the accompanying diagrammatic drawings to the diagrammatic drawings accompanying the provisional specification in which FIGURES 1 and 2 are graphs showing the composition of the semiconductor body and the concentration C of impurity centres therein during an initial stage and a final stage in the manufacture respectively. The concentrations C are shown as ordinates and the distances from the surface of the body as abscissae.

The photo-diode comprises a semiconductor body having a first portion of 1 of 10 microns thickness formed by epitaxial deposition of gallium arsenide on a second portion 2 of gallium indium arsenide with an interface 3 therebetween. The second portion 2 is present in a substrate of gallium arsenide of 1 mm. x 1 mm. initially of 200 microns thickness (FIGURE 1) and finally of 150 microns thickness (FIGURE 2) and is formed by diffusion of indium into the substrate. The substrate of gallium arsenide into which the indium is diffused initially contains a substantially uniform concentration of $3\times10^{17}$ atoms/cc. of tin. The epitaxially deposited material of the first portion initially contains a substantially uniform concentration of $3\times10^{15}$ atoms/cc. of zinc. FIGURE 1 shows the composition of and the impurity concentrations in the semiconductor body subsequent to the epitaxial deposition of the first portion on the second portion. The second portion is shown as having a diffused indium concentration which at the interface between the first and second portions is present in a concentration of about $3\times10^{21}$ atoms/cc. so that the material of the second portion adjacent the interface is of gallium arsenide ($Ga_{1-x}In_xAs$) where $0.1<X<0.15$. The indium concentration decreases from the interface and beyond a depth of about 10 microns into the substrate which is of unsubstituted gallium arsenide.

FIGURE 2 shows the composition of and the impurity concentrations in the semiconductor body at a final stage in the manufacture. The indium in the second portion 2 has been diffused into the first portion 1 so that a part of this first portion adjacent the interface now consists of gallium indium arsenide. The indium concentration decreases in the direction from the interface towards the surface of the first portion and at a distance of about 4.5 microns from the interface, that is about 5.5 microns from the surface, the indium concentration is zero so that the remaining thickness of the first portion is of unsubstituted gallium arsenide.

A p-n junction 4 is situated in the first portion in the part consisting of gallium indium arsenide. The p-n junction lies parallel to the interface 3 and is spaced therefrom by about 0.25 micron. This location of the junction has been obtained by the diffusion of tin from the second portion 2 into the epitaxially deposited first portion 1 similtaneous with the diffusion of indium from the second portion 2 into the first portion 1. In FIGURE 2 the initial indium, tin and zinc concentration profiles are shown in dotted lines and the final concentration profiles by full lines. The body thus consists of a first, p-type region which lies wholly within the first portion and a second, n-type region which lies predominantly in the second portion with the p-n junction lying in the first portion spaced from the interface between the first and second portions and in a part of the first portion consisting of gallium indium arsenide.

The photo-diode is suitable for detecting radiation having photon energies lying between the energy gaps of gallium arsenide and gallium indium arsenide and in normal operation with an applied reverse voltage of about 8 volts the depletion region of the junction 4 will extend about 2.5 microns on the p-side of the junction and about 0.25 micron on the n-side of the junction so that in accordance with further features of the invention the p-n junction is spaced from the interface by a distance such that in operation the depletion region of the junction lies within the first portion and lies wholly within that part of the first portion consisting of gallium indium arsenide. The 5.5 microns of unsubstituted gallium arsenide of the first portion adjacent the surface is transparent to radiation having photon energies less than the energy gap of gallium arsenide.

The surface of the first portion has a layer of silicon oxide thereon. An opening in the silicon oxide layer contains a gold/zinc ohmic contact which has been alloyed to the p-type gallium arsenide. The semiconductor body is mounted on a header with the substrate, in which the second portion is present, soldered to the base of the header and a gold connecting wire between the gold/zinc ohmic contact and a post on the header. A cap part is sealed over the header and has a window for incidence of radiation on the semiconductor body.

A photo-diode in which the semiconductor body has the composition and impurity concentrations as shown in FIGURE 2 is manufactured as follows:

A monocrystalline body of n-type gallium arsenide having tin as a donor impurity in a concentration of $3\times10^{17}$ atoms/cc. in the form of a slice 1 cm. x 1 cm. is lapped to a thickness of about 200 microns. Indium is now diffused into the body at 900° C. for 12 hours. This yields a penetration depth of at least 10 microns and an indium surface concentration of about $3\times10^{21}$ atoms/cc. The body is transferred to an epitaxial growth apparatus and a few microns thickness may be removed from the surface by vapour etching and yield a suitable surface on which the material of the first portion can be epitaxially deposited.

A layer of p-type gallium arsenide of 10 microns thickness is epitaxially deposited on the prepared surface by deposition from the vapour phase. The gallium arsenide layer is formed at 750° C. by the reaction of gallium and arsenic, the gallium being produced by the disproportionation of gallium monochloride and the arsenic being produced by the reduction of arsenic trichloride with hydrogen. Simultaneous with the deposition of gallium arsenide zinc is deposited such that in the epitaxially grown layer there is a uniform concentration of zinc of $3\times10^{15}$ atoms/cc. Growth is continued until a layer of 10 microns thickness is obtained.

A silicon oxide layer is grown on the surfaces of the body by the reaction of dry oxygen with tetraethyl silicate at a temperature of 350° C.–450° C.

The body is then placed in a tube and heated at 900° C. for 1 hour. During this heating step a redistribution of the indium and tin in the body occurs and also zinc to a small extent. The indium diffuses from the substrate into the epitaxial layer such that the final indium concentration decreases to zero at a distance of about 4.5 microns from the interface. The tin in the substrate diffuses into the epitaxial layer such that at about 0.25 micron from the interface its concentration is equal to that of the zinc in the epitaxial layer and the p-n junction is thus located. Simultaneously zinc diffuses into the second portion 2 as is shown in full line in FIGURE 2.

A photo-sensitive resist layer is applied to the surface of the silicon oxide layer covering the epitaxially deposited layer. With the aid of a mask the photo-sensitive resist is exposed such that a plurality of circular areas of 30 microns diameter with a mutual spacing of 1 mm. are shielded from the incident radiation. The unexposed parts of the resist layer are removed with a developer so that a plurality of openings are formed in the resist layer. Etching is then carried out to form openings in the silicon oxide layer below the openings in the resist layer and thus expose a plurality of areas on the surface of the epitaxially deposited layer of the first portion. The etchant used consists of a solution of 25% ammonium fluoride and 3% hydrofluoric acid in water.

Ohmic contact to the p-type region exposed by the openings is made by evaporating gold containing 4% zinc over the surface of the body comprising the silicon oxide layer and in which the openings are formed so that a gold 4% zinc contact layer is deposited in each opening in the silicon oxide layer. The amount of gold/zinc evaporated over the surface is such as to be insufficient to fill the openings and the filling is thereafter effected with a protective lacquer of "Cerric Resist." The remainder of the gold/zinc layer on the upper surface of the body is removed with the exposed portion of the photosensitive resist layer, by softening the resist layer in trichlorethylene and rubbing. The protective lacquer of "Cerric Resist" in the openings above the gold/zinc contact layers is removed by dissolving in acetone. The body is placed in a furnace and heated to 500° C. for five minutes to alloy the gold/zinc contact layers to the underlying p-type region.

The body is then diced up into a plurality of individual photo-diode sub-assemblies at positions between the gold/zinc contact areas so that each photo-diode sub-assembly consists of a smaller wafer 1 mm. x 1 mm. having a gold/zinc ohmic contact to the p-type region. The surface of the region has a silicon oxide layer thereon surrounding the contact. This silicon oxide layer on the surface of the epitaxially deposited layer may be removed if desired. The opposite surface of the body is ground to remove both the silicon oxide layer and about 50 microns of the substrate.

The photo-diode sub-assembly is then mounted on a header by soldering the n-type gallium arsenide substrate to the base of the header with tin, thermo-compression bonding a gold wire onto the gold/zinc contact and connecting the gold wire to a terminal post on the header followed by final sealing on of the cap part.

It will be obvious that the invention is not restricted to the embodiment described above and that within the scope of the invention many variants are possible. For example, apart from the photo-electric diodes included in this embodiment, opto-electronic transistors and other semi-conductor devices may be manufactured; the materials to be used are not restricted either to the compounds and elements mentioned herein.

What is claimed is:

1. A semiconductor device comprising a semiconductor monocrystalline body having a first deposited epitaxial portion formed of a III–V semiconductor compound material or of a substituted III–V semiconductor compound material and a second substrate portion of a substituted III–V semiconductor compound of lower energy gap material than that of the deposited epitaxial first portion, the compound of said second portion comprising one or more substitutional elements of said III-elements or said V-elements diffused thereinto, and a p-n junction disposed within said body.

2. A semiconductor device as set forth in claim 1 wherein the part of said first portion adjacent the second portion also comprises the same said substitutional element in said second portion whereby said part is a substituted III–V semiconductor compound.

3. A semiconductor device as set forth in claim 1 wherein the p-n junction is disposed substantially along the interface between the first and second portions.

4. A semiconductor device as set forth in claim 1 wherein the first portion is of GaAs or $GaAs_{1-x}P_x$ and the second portion is of $Ga_{1-x}In_xAs$ with In comprising the diffused substitutional element.

5. A semiconductor device as set forth in claim 1 wherein the first portion is of GaP and the second portion is of $GaAs_{1-x}P_x$ with phosphorus comprising the diffused substitutional element.

6. A semiconductor device as set forth in claim 1 wherein the p-n junction is the photosensitive junction of a photo-diode, the first portion is p-type GaAs or $GaAs_{1-x}P_x$, and the second portion is n-type $Ga_{1-x}In_xAs$ with In constituting the diffused element.

7. A device as set forth in claim 1 wherein the device is an opto-electronic transistor comprising base and collector regions forming a base-collector junction, said p-n junction coinciding with the base-collector junction.

8. A semiconductor device comprising a semiconductor monocrystalline body having a first deposited epitaxial portion formed of a III–V semiconductor compound material or of a substituted III–V semiconductor compound material and a second substrate portion of a substituted III–V semiconductor compound of lower energy gap material than that of the deposited epitaxial first portion, the compound of said second portion comprising one or more substitutional elements of said III-elements or said V-elements diffused thereinto, and a p-n junction disposed within the second portion of said body spaced from its interface with the first portion.

9. A semiconductor device as set forth in claim 8 wherein the said first portion comprises a substantially uniform concentration of conductivity type determining impurities of the one type, and the second portion comprises a substantially uniform concentration of conductivity type determining impurities of the opposite type except at the regions adjacent the first portion, the concentration of impurities in the second portion being higher than that in the first portion, the concentration of one-type impurities in the regions of the second portion adjacent the first portion declining in the direction into the second portion.

10. A semiconductor device comprising a semiconductor monocrystalline body having a first deposited epitaxial portion formed of a III–V semiconductor compound material or of a substituted III–V semiconductor compound material and a second substrate portion of a substituted III–V semiconductor compound of lower energy gap material than that of the deposited epitaxial first portion, the compound of said second portion comprising one or more substitutional elements of said III-elements or said V-elements diffused thereinto, the part of said first portion adjacent the second portion also comprising the same said substitutional element whereby said part is a substituted III–V compound, and a p-n junction disposed within the said part of the first portion of said body and spaced from its interface with the second portion.

11. A semiconductor device as set forth in claim 10 wherein the said first portion comprises a substantially uniform concentration of conductivity type determining impurities of the one type except at the regions adjacent the second portion, and the second portion comprises a substantially uniform concentration of conductivity type determining impurities of the opposite type, the concentration of impurities in the second portion being higher than that in the first portion, the concentration of opposite type impurities in the regions of the first portion adjacent the second portion declining in the direction into the first portion.

12. A semiconductor device as set forth in claim 10 wherein the said part comprises $Ga_{1-x}In_xAs$, and the second part is n-type material.

References Cited

UNITED STATES PATENTS

| | | | |
|---|---|---|---|
| 3,146,137 | 8/1964 | Williams | 148—175 |
| 3,154,446 | 10/1964 | Jones | 148—189 |
| 3,200,259 | 8/1965 | Braunstein | 307—88.5 |
| 3,271,636 | 9/1966 | Irvin | 317—237 |

JAMES D. KALLAM, *Primary Examiner.*

U.S. Cl. X.R.

148—1.5

PO-1050
(5/69)

UNITED STATES PATENT OFFICE

CERTIFICATE OF CORRECTION

Patent No. 3,436,625 Dated April 1, 1969

Inventor(s) PETER COLIN NEWMAN

It is certified that error appears in the above-identified patent and that said Letters Patent are hereby corrected as shown below:

Column 4, line 41, "charactersitic" should have read --characteristic-- .

Column 4, line 52, "No. 14,739/65 (PHB 31,424)" should have read --Serial No. 480,344, filed 17 August 1965,--

Column 4, lines 55 and 56, "British patent application No. 33,875/64 (PHB 31,325)" should have read --patent application Serial No. 479,412, filed 13 August 19 now Patent No. 3,351,828-- .

Column 6, line 24, "No. 33,875/64" should have read --Serial No. 479,412-- .

Column 6, lines 45-47, "of example, to the accompanying diag matic drawings to the diagrammatic drawings accompanying the provisional specification in whic should have read --of example, together with detai of its method of manufacture, with reference to the accompanying diagrammatic drawings in which-- .

SIGNED AND SEALED
JUN 9 1970

(SEAL)
Attest:

Edward M. Fletcher, Jr.
Attesting Officer

WILLIAM E. SCHUYLER, JR.
Commissioner of Patents